(12) United States Patent
Kubena et al.

(10) Patent No.: US 10,177,737 B1
(45) Date of Patent: Jan. 8, 2019

(54) HIGH-Q QUARTZ-BASED INDUCTORS FOR HIGH POWER LF COMMUNICATION

(71) Applicant: HRL LABORATORIES, LLC, Malibu, CA (US)

(72) Inventors: Randall L. Kubena, Oak Park, CA (US); Walter S. Wall, Santa Monica, CA (US)

(73) Assignee: HRL Laboratories, LLC, Malibu, CA (US)

( * ) Notice: Subject to any disclaimer, the term of this patent is extended or adjusted under 35 U.S.C. 154(b) by 0 days.

(21) Appl. No.: 15/803,059

(22) Filed: Nov. 3, 2017

Related U.S. Application Data

(60) Provisional application No. 62/417,803, filed on Nov. 4, 2016.

(51) Int. Cl.
| | | |
|---|---|---|
| *H04B 1/40* | (2015.01) | |
| *H03H 9/19* | (2006.01) | |
| *H01L 41/047* | (2006.01) | |
| *H03H 9/56* | (2006.01) | |

(52) U.S. Cl.
CPC ............. *H03H 9/19* (2013.01); *H01L 41/047* (2013.01); *H03H 9/56* (2013.01); *H04B 1/40* (2013.01)

(58) Field of Classification Search
CPC .... H03H 3/02; H03H 9/173; H03H 2003/021; H03H 2003/023; H03H 3/04; H03H 9/02031; H03H 9/02086; H03H 9/13; H03H 9/132; H03H 9/174; H03H 9/175
USPC .......................................................... 455/76
See application file for complete search history.

(56) References Cited

U.S. PATENT DOCUMENTS

| | | | | |
|---|---|---|---|---|
| 4,221,986 A | * | 9/1980 | Besson | .................. H03H 9/132 |
| | | | | 310/344 |
| 2011/0227658 A1 | * | 9/2011 | Tanaya | .................. H03H 9/0504 |
| | | | | 331/156 |

* cited by examiner

*Primary Examiner* — Ajibola Akinyemi
(74) *Attorney, Agent, or Firm* — Lewis Roca Rothgerber Christie, LLP

(57) ABSTRACT

A high quality-factor electromechanical resonator that includes a tapered quartz crystal member having a first tapered portion, a second tapered portion, and an active portion between the first and second tapered portions, the active portion having a first edge portion and a second edge portion extending from the first tapered portion to the second tapered portion, each of the first and second portions being tapered along a longitudinal axis away from the active portion, a first electrode coupled to the first edge portion of the active portion and configured to apply a first voltage to the active portion, and a second electrode coupled to the second edge portion of the active portion and configured to apply a second voltage to the active portion, wherein the first and second electrodes are spaced apart along a lateral axis.

20 Claims, 3 Drawing Sheets

HIGH-Q QUARTZ-BASED INDUCTORS FOR HIGH POWER LF COMMUNICATION

CROSS-REFERENCE TO RELATED APPLICATION(S)

This application claims priority to, and the benefit of, U.S. Provisional Application No. 62/417,803 ("High-Q Quartz-based Inductors for High Power LF Transmitters"), filed on Nov. 4, 2016, the entire content of which is incorporated herein by reference.

This application is related to U.S. application Ser. No. 15/638,052 ("Antenna Loaded with Electromechanical Resonators"), filed on Jun. 29, 2016, the entire content of which is incorporated herein by reference.

FIELD

Aspects of the present invention relate to the field of resonators for antenna systems.

BACKGROUND

The global positioning system (GPS) is the primary means of obtaining position, navigation, and timing (PNT) information, yet GPS receivers are vulnerable to jamming and interference due to their low expected signal strength and corresponding sensitivity. Because of these issues, a robust navigation alternative is desired for some sensitive applications, such as military and defense applications.

Terrestrial-based very low frequency (VLF; e.g., 3-30 kHz) and low frequency (LF; e.g., 30-300 kHz) beacons offer a compelling solution to this problem due to their ability to transmit PNT information over long distances using the Earth's ionosphere waveguide. Such beacons may also be of particular use in GPS-denied applications and underwater communication. However, the use of large and heavy coil inductors (which may be several $m^3$ in volume, with weights of about 450 kg) for impedance matching typically leads to these systems having massive antennas (e.g., >300 m in height and 2.5 $km^2$ in area), which significantly limit their deployment.

What is desired is a means for enabling new compact VLF/LF beacons, transmitters, and/or receivers with the ability to enable long range transmission of information (e.g., PNT information) from widely deployable and more easily relocatable stations.

The above information disclosed in this Background section is only for enhancement of understanding of the invention, and therefore it may contain information that does not form the prior art that is already known to a person of ordinary skill in the art.

SUMMARY

Aspects of embodiments of the present invention are directed toward a high quality-factor (high-Q) electromechanical device with high inductance for enabling small and high-efficiency transmitter systems operating at a variety of frequency ranges, such as the very low frequency (VLF) and low frequency (LF) bands and at high power levels.

Aspects of embodiments of the present invention are directed toward an LF high-Q quartz-based resonator that acts as a low loss matching inductor capable of operating at high power levels.

Aspects of embodiments of the present invention are directed toward an extensional-mode quartz resonator capable of operating at VLF and LF bands while exhibiting high-Q and high frequency stability over operating temperature ranges.

According to some embodiments of the present invention, there is provided a high quality-factor electromechanical resonator including: a tapered quartz crystal member having a first tapered portion, a second tapered portion, and an active portion between the first and second tapered portions, the active portion having a first edge portion and a second edge portion extending from the first tapered portion to the second tapered portion, each of the first and second portions being tapered along a longitudinal axis away from the active portion; a first electrode coupled to the first edge portion of the active portion and configured to apply a first voltage to the active portion; and a second electrode coupled to the second edge portion of the active portion and configured to apply a second voltage to the active portion, wherein the first and second electrodes are spaced apart along a lateral axis crossing the longitudinal axis.

In some embodiments, the first and second voltages generate an electric field across the active portion that induces acoustical vibrations within the active portion along the lateral axis, and the acoustical vibrations are in the low frequency (LF) to very low frequency (VLF) ranges.

In some embodiments, the first and second tapered portions are configured to confine low frequency oscillation modes induced by the electric field to the active portion.

In some embodiments, the first and second electrodes wrap around and clamp the first edge portion and the second edge portion, respectively.

In some embodiments, the first and second electrodes extend along the longitudinal axis.

In some embodiments, the high quality-factor electromechanical resonator further includes: a first tethering member coupling a first extremity of the first tapered portion to a first pair of bonding pads; and a second tethering member coupling a second extremity of the second tapered portion to a second pair of bonding pads, wherein each of the first and second pair of bonding pads face the first and second electrodes along the lateral axis.

In some embodiments, the first and second pair of bonding pads lie on a horizontal plane that extends along the lateral and longitudinal axes and is parallel to a plane of extension of the tapered quartz crystal member.

In some embodiments, each of the first and second tethering members has a first portion extending along the lateral axis, a second portion extending along the longitudinal axis, and a convex corner between the first and second portions, and the first and second tethering members form a partial frame around the tapered quartz crystal member.

In some embodiments, a longitudinal distance between the first and second pair of bonding pads is less than a length of the first and second electrodes along the longitudinal axis.

In some embodiments, each of the first and second tethering members includes: a quartz layer integrated with the tapered quartz crystal member; a bonding pad configured to receive a respective one of the first and second voltages; and a conductive layer electrically coupling the bonding pad to a respective one of the first and second electrodes via a respective one of a first connection and a second connection.

In some embodiments, the quartz layer and the tapered quartz crystal member are carved out of a same quartz crystal slice and form a continuous body.

In some embodiments, the high quality-factor electromechanical resonator further includes: a substrate; a first protrusion on the substrate and coupled to the first tethering member; and a second protrusion on the substrate and coupled to the second tethering member, wherein the first and second protrusions are configured to physically support and to separate the tapered quartz crystal member and the first and second tethering members from the substrate along a vertical axis crossing the longitudinal and lateral axes.

In some embodiments, the high quality-factor electromechanical resonator further includes: a thermo-electric cooler coupled to the substrate and configured to cool the substrate.

In some embodiments, the tapered quartz crystal member is hermetically sealed in a vacuum package.

In some embodiments, the tapered quartz crystal member is a Z-cut theta angle of 27 degrees rotated counter-clockwise around an X axis.

In some embodiments, the first electrode is laterally spaced from the second electrode by 10 mm or more.

In some embodiments, a length of the tapered quartz crystal member along the longitudinal axis is about 150 mm and a width of the tapered quartz crystal member along the lateral axis is about 86 mm.

In some embodiments, an extensional-mode fundamental frequency of the extensional-mode fundamental frequency is about 32 kHz.

According to some embodiments of the present invention, there is provided an antenna system including: an antenna configured to transmit a wireless signal based on an input signal, or to receive the wireless signal and to generate the input signal based on received wireless signal; a transceiver circuit coupled to the antenna and configured to supply the input signal to the antenna or to receive the input signal from the antenna; and a high quality-factor electromechanical resonator coupled to the antenna and the transceiver circuit and configured to facilitate network matching in the antenna system, the high quality-factor electromechanical resonator includes: a tapered quartz crystal member having a first tapered portion, a second tapered portion, and an active portion between the first and second tapered portions, the active portion having a first edge portion and a second edge portion extending from the first tapered portion to the second tapered portion, each of the first and second portions being tapered along a longitudinal axis away from the active portion; a first electrode coupled to the first edge portion of the active portion and configured to apply a first voltage to the active portion; and a second electrode coupled to the second edge portion of the active portion and configured to apply a second voltage to the active portion, wherein the first and second electrodes are spaced apart along a lateral axis crossing the longitudinal axis.

In some embodiments, the first electrode is electrically coupled to the antenna and the second electrode is electrically coupled to the transceiver circuit.

BRIEF DESCRIPTION OF THE DRAWINGS

The accompanying drawings, together with the specification, illustrate example embodiments of the present invention, and, together with the description, serve to explain the principles of the present invention.

DETAILED DESCRIPTION

Figure 1A:
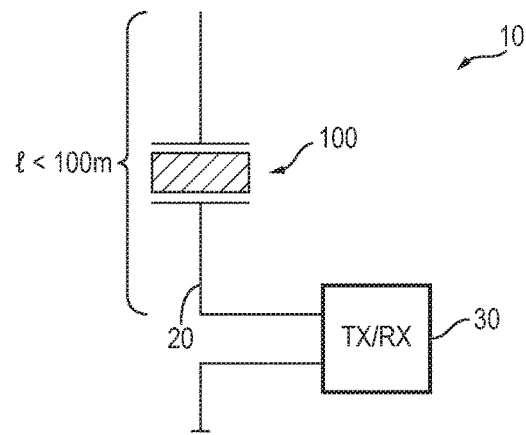
FIG. 1A is a schematic illustration of an antenna system utilizing a high-Q electromechanical resonator, according to some example embodiments of the present invention.

In the following detailed description, only certain example embodiments of the present invention are shown and described, by way of illustration. As those skilled in the art would recognize, the invention may be embodied in many different forms and should not be construed as being limited to the embodiments set forth herein. Descriptions of features or aspects within each example embodiment should typically be considered as being available for other similar features or aspects in other example embodiments. Like reference numerals designate like elements throughout the specification.

FIG. 1A is a schematic illustration of an antenna system 10 utilizing a high-Q electromechanical resonator 100, according to some embodiments of the present invention.

Referring to FIG. 1A, the antenna system 10 includes an antenna 20 for transmitting a wireless signal based on an input signal or for receiving the wireless signal to generate the input signal, a transceiver (e.g., transmitter circuit or a receiver circuit) 30 coupled to the antenna 20 and supply the input signal to the antenna 20 or to receive the input signal from the antenna 20, and an electromechanical resonator 100 to facilitate network matching, and may operate as a low frequency (LF; e.g., 30-300 kHz) or very low frequency (VLF; e.g., 3-30 kHz) beacon/transmitter or receiver. The antenna system 10 may be employed in a variety of suitable applications, such as underwater short-range communication, Position, Navigation, and Timing (PNT) alternatives to GPS for long range communication, or the like.

The radiation efficiency of the antenna system 10 may be defined as radiation power divided by input power. This may be formulaically expressed, in simplified form, as:

$$\text{Radiation Efficiency} = R_r / (R_r + R_a + R_m) \qquad \text{(Equation 1)}$$

where $R_r$ represents the radiation resistance, $R_a$ represents the ohmic resistance, and $R_m$ represents the matching network resistance. Electrically small antennas at VLF/LF frequencies have poor radiation efficiency due to small radiation resistance and large input negative reactance, thus requiring massive radiating structures (e.g., with height>300 m and area>2.5 km$^2$) for efficient operation. In order to match these antennas, large coiled inductors are utilized in the related art. However, the limited inductor Q (e.g., <2000) of the coiled inductors increases losses ($R_m$) in the matching network, and the large inductor size (e.g., >1 m$^3$) and weight (e.g., >1000 lbs) makes center loading impractical, and requires capacitive top loading for efficient current distribution, which significantly increases antenna size.

According to some embodiments of the present invention, a compact and more easily relocatable VLF and LF antenna system 10 is enabled by replacing the large and heavy inductor coils with one or more lightweight and compact electromechanical resonators 100. Unlike traditional inductive coils, which create inductance by storing energy in the magnetic field of a coil, the electromechanical resonator 100 creates inductance by storing energy in a mechanical mode. This allows the electromechanical resonator 100, according to some embodiments, to create large inductances (e.g., as large as 50 H range at 40 kHz) with significantly less resistance. By greatly reducing this resistance, as compared to coil inductors, the electromechanical resonator 100, according to some embodiments, enables at least an order of magnitude improvement (e.g., increase) in antenna efficiency.

Unlike the related-art large inductors for VLF and LF transmitters, the electromechanical resonators 100, according to some embodiments, are also significantly more compact and lightweight (e.g., <0.3 L in size and <1 lb in weight). Due to their considerably smaller size and lower weight, the electromechanical resonators 100 may be loaded directly into the center of VLF/LF antennas 20 (e.g., monopole antennas 20), as shown in FIG. 1A, eliminating the need for large capacitive top loading structures and reducing the area of these antennas by several orders of magnitude (e.g., by about 10000 times). This large reduction in the size, weight, and area of these antennas allows VLF and LF transmitters and/or receivers to be constructed and relocated with significantly less effort and at much lower cost, thus enabling more robust PNT networks.

Figure 1B:
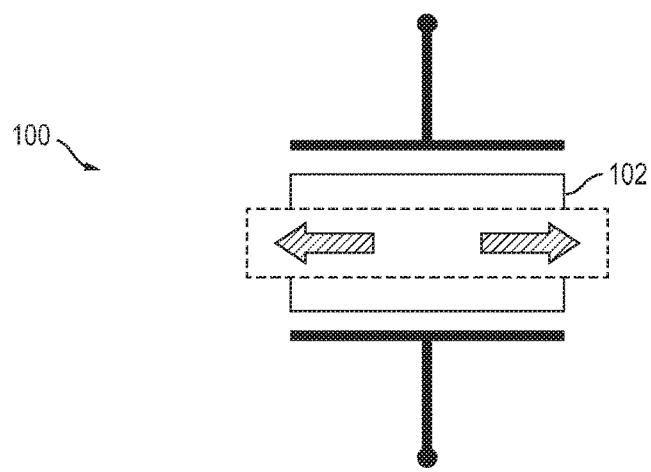
FIG. 1B schematically illustrates a high quality-factor electromechanical resonator, according to some example embodiments of the present invention.
Figure 1C:
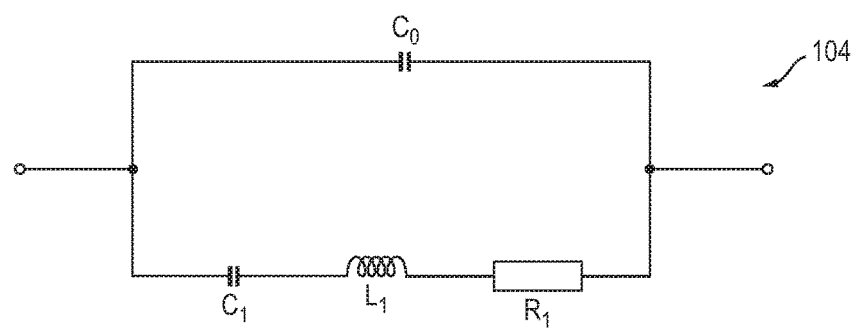
FIG. 1C illustrates an equivalent electrical circuit to the high quality-factor electromechanical resonator of FIG. 1A.

FIG. 1B schematically illustrates a high quality-factor electromechanical resonator 100, according to some embodiments of the present invention. FIG. 1C illustrates an equivalent electrical circuit to the high quality-factor electromechanical resonator 100 of FIG. 1A.

Referring to FIG. 1B, in some embodiments, the high quality-factor (high-Q) electromechanical resonator 100 (hereinafter also referred to as the "resonator") is an extensional-mode high-Q quartz resonator, which may operate as a narrowband inductor capable of improving the radiation efficiency of antennas while also reducing its footprint and weight, thus greatly improving the antenna's portability and ease of deployment.

Under an oscillating voltage, the piezoelectric material 102 of the resonator 100, which in some embodiments is a quartz crystal, transfers energy very efficiently between electrical and mechanical modes, thus establishing a high-Q resonance. In the electrical domain, the resonance may be represented as the RLC circuit 104 of FIG. 1C, where $L_1$ and $R_1$ respectively represent the effective inductance and motional resistance of the resonator 100. When oscillating at off-resonance, the resonator 100 may behave like a high-Q inductor.

The resonator 100 achieves large inductance values (e.g., about 10 to about 40 H) with small motional resistance (e.g., about 100 times smaller than comparable coiled inductors), thus enabling compact high-Q (e.g., $>10^3$) inductors. When used as narrowband inductors for antennas, the resonator 100 may be significantly lighter (e.g., <1 g) and more compact (e.g., <1 cm$^2$) than traditional high-Q inductors, such as coiled inductors, thus allowing for inductive center loading on VLF and LF antennas. Additionally, when utilized in an antenna 20, the motion resistance of $R_1$ of the resonator 100, which may be equated with the matching network resistance of the antenna $R_m$ shown in Equation 1, is significantly lower than the resistance of traditional high-Q inductors. As a result, the resonator 100 may not only operate at high power levels (e.g., >10 W), but also act as a low loss matching inductor that greatly improves (e.g., increases) the radiation efficiency of the antenna 20.

Figure 2A:
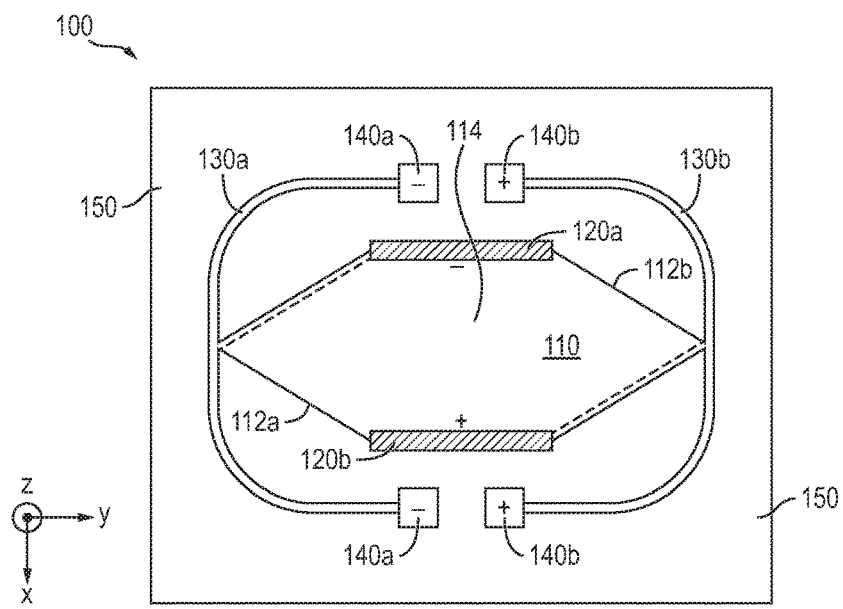
FIG. 2A illustrates a top view of a high quality-factor electromechanical resonator, according to some example embodiments of the present invention.
Figure 2B:
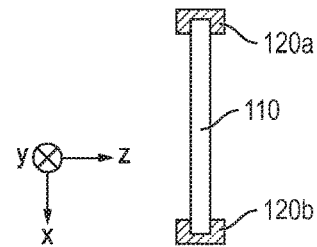
FIG. 2B illustrates a side view of a tapered quartz crystal member of FIG. 2A, according to some example embodiments of the present invention.
Figure 2C:
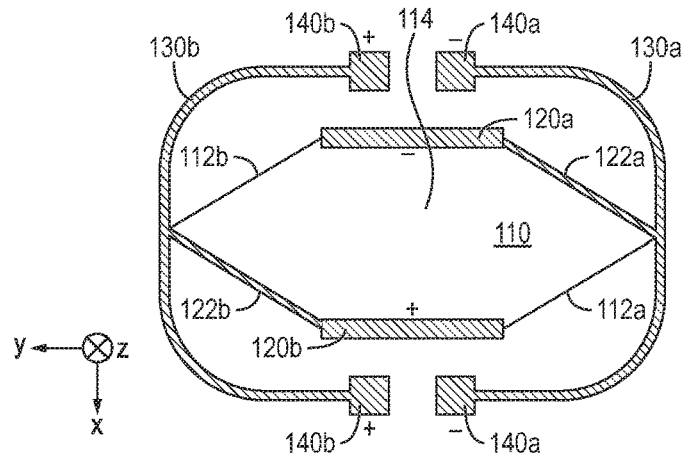
FIG. 2C illustrates a back view of the high quality-factor electromechanical resonator of FIG. 2A, according to some example embodiments of the present invention.

FIG. 2A illustrates a top view of the high quality-factor electromechanical resonator 100, according to some embodiments of the present invention. FIG. 2B illustrates a side view of a tapered quartz crystal member 110 of FIG. 2A, according to some embodiments of the present invention. FIG. 2C illustrates a back view of the high quality-factor electromechanical resonator 100 of FIG. 2A, according to some embodiments of the present invention.

According to some embodiments, the resonator 100 includes a tapered quartz crystal member 110 having a first tapered portion 112a, a second tapered portion 112b, and an active portion 114 that is between the first and second tapered portions. Both of the first and second tapered portions 112a and 112b are tapered along a longitudinal axis (e.g., the Y axis) away from the active portion 114. The resonator 100 further includes a first electrode 120a and a second electrode 120b that are respectively coupled to a first edge portion and a second edge portion of the active portion 114, which extend from the first tapered portion 112a to the second tapered portion 112b (e.g., along the longitudinal or Y axis). As the first and second electrodes 120a and 120b are spaced apart along a lateral direction (e.g., the X axis), the first and second voltages respectively applied to the first and second electrodes 120a and 120b generate a differential voltage across the active portion 114 along the lateral direction. When the differential voltage is varying (e.g., oscillating), the resulting electric field across the active portion 114 induces vibrations (e.g., acoustical vibrations) within the active portion 114 of the tapered quartz crystal member 110 along the lateral axis.

Thus, the active portion 114 can support an extensional mode between the first and second electrodes 120a and 120b. Because the resonant frequency within the geometry of the tapered quartz crystal member 110 is dependent on the inverse width dimension in the lateral direction, the tapered geometry supports only higher frequency modes and not the lower frequency modes of the active portion 114. As the fundamental resonance in the first and second tapered portions 112a and 112b decays exponentially away from the active portion 114, the first and second tapered portions 112a and 112b support higher frequency modes, but do not support the lower frequency modes of the active portion 114. As such, the first and second tapered portions 112a and 112b promote modal confinement, effectively trapping the fundamental mode between the first and second electrodes 120a and 120b in the active portion 114. This modal trapping allows the tapered quartz crystal member 110 to act as a low frequency filter, which increases the Q of the electromechanical resonator 100. Increasing the longitudinal length of the tapered portions 112a and 112b may provide a higher degree of modal trapping which may further the Q of the resonator 100.

While the first and second tapered portions 112a and 112b illustrated in FIG. 2A have a triangular shape (i.e., are linearly tapered), thus giving the tapered quartz crystal member 110 a hexagonal shape, embodiments of the present invention are not limited thereto. In some embodiments, the first and second tapered portions 112a and 112b may have a non-linear taper and may, for example, have concave or convex edges. As a faster taper at the first and second tapered portions 112a and 112b may lead to better modal confinement in the active portion 114, a concave taper in the first and second tapered portions 112a and 112b may produce an even higher Q than that of the linear taper shown in FIG. 2A.

According to some embodiments, the resonator 100 further includes first and second tethering members 130a and 130b that respectively couple a first extremity (e.g., a first tip) of the first tapered portion 112a and a second extremity (e.g., a second tip) of the second tapered portion 112b to a first pair of bonding pads 140a and a second pair of bonding pads 140b. The bonding pads 140a and 140b may be coupled to (e.g., fixed to) a substrate (e.g., a base) 150 above which the tapered quartz crystal member 110 is suspended.

Because for some embodiments vibrational energy (and vibrational displacement) is lowest at the extremities (e.g., the sections farthest from the active portion along the y-axis) of the first and second tapered portions 112a and 112b, coupling the first and second tethering members 130a and 130b to the tapered quartz crystal member 110 at these locations may reduce or minimize the amount of vibrational energy that is coupled into the tethering members 130a and 130b. This additional degree of modal isolation provided by the tethering members 130a and 130b in turn may further increase the Q of the resonator 100.

In some embodiments, the tethering members 130a and 130b bend back from the extremities of the first and second tapered portions 112a and 112b toward the active portion 114, such that the first and second pair of bonding pads 140a and 140b are near, and face, the first and second electrodes 120a and 120b along the lateral axis (i.e., the first and second electrodes 120a and 120b are between each of the first and second pair of bonding pads 140a and 140b along the lateral axis). Thus, from a plan view (e.g., shown in FIG. 2A), the first and second tethering members 130a and 130b form a partial frame around the tapered quartz crystal member 110.

In some examples, each of the first and second tethering members 130a and 130b has a first portion extending along the lateral axis (e.g., the X axis), a second portion extending along the longitudinal axis (e.g., the Y axis), and a middle portion between the first and second portions. In some embodiments, the middle portion is curved/rounded and appears as a convex corner, such that a center of curvature of an arc of the convex corner falls between the convex corner and the tapered quartz crystal member 110. The rounded corner of the first and second tethering members 130a and 130b serve to increase their resistance against breakage or cracking under vibration, as compared to tethering members having sharp (e.g., 90 degree angle) corners. However, embodiments of the present invention are not limited to the tethering members 130a and 130b described above and illustrated in FIG. 1, and the tethering members 130a and 130b may have any suitable shape.

As illustrated in FIG. 2A, the tapered quartz crystal member 110 and the first and second tethering members 130a and 130b may be symmetric about a vertical plane of symmetry (e.g., the X-Z plane) extending along the longitudinal axis.

According to some embodiments, the first and second tethering members 130a and 130b are integrated with and made of the same material (i.e., quartz crystal) as the tapered quartz crystal member 110. In some embodiments, the tapered quartz crystal member 110 and the first and second tethering members 130a and 130b are formed from the same crystal stone by obtaining a cultured crystal stone, cutting a wafer (e.g., a 6" diameter wafer approximately 14 mm thick) from the cultured crystal stone at a KT-cut (a singly rotated Z-cut) angle relative to the crystal optical angle, and etching the wafer to form the cut wafer to form the tapered quartz crystal member 110 and the first and second tethering members 130a and 130b as one continuous piece of crystal. The cultured crystal stone may be cut using a saw blade, and the machining of the wafer may be performed via a computer aided design tool, such as diamond cutting, laser ablation, and/or the like. In some examples, the etched wafer may then be polished to remove any sawing sub-surface damage. The singly rotated quartz cuts may yield near "AT-cut temperature compensation" levels (i.e., ±20 ppm fractional frequency variations over military specification temperature ranges (e.g., −40° C. to +85° C.) with this design.

During operation, the resonator 100 may generate substantial heat. Any difference between the thermal expansion coefficient of the substrate 150 (which, e.g., may be made of copper) and that of the tapered quartz crystal member 110 and the tethering members 130a and 130b, may lead to displacement of the bonding pads 140a and 140b, which in turn may result in stress induced in the overall structure, and in particular, in the tapered quartz crystal member 110. Unabated, this stress may result in a change in the resonant frequency of the tapered quartz crystal member 110, which is undesirable. Thus, according to some embodiments of the invention, the bonding pads 140a and 140b are kept as close to each other, at least longitudinally, as possible (while satisfying design rules) in order to reduce or minimize displacement of the bonding pads 140a and 140b, and as a result, reduce or minimize any stress that may be induced in the tapered quartz crystal member 110. As such, the stability of resonant frequency over temperature may be increased. The flexibility of the tethering members 130a and 130b also serves to further reduce any such stress on the tapered quartz crystal member 110. For similar reasons, according to some embodiments, the bonding pads 140a and 140b may be positioned as close to the corresponding electrodes 120a and 120b as allowed under design rules, to reduce or minimize stress induced due to mount displacement in the lateral direction.

Referring to FIG. 2B, in some embodiments, the first and second electrodes 120a and 120b, which extend along the longitudinal axis, wrap around and clamp the first edge portion and the second edge portion of the tapered quartz crystal member 110, respectively. Thus, the first and second electrodes 120a and 120b may contact the top surface, bottom surface, and side surface of the active portion 114 at the edge portion of the tapered quartz crystal member 110. This may provide a more uniform distribution of induced electric field in the active portion 114. The first and second electrodes 120a and 120b may be formed using a shadow masking technique and/or any other suitable method.

Referring to FIG. 2C, according to some embodiments, additional conductive material (e.g., metal) is deposited to form a conductive layer including first and second interconnects 122a and 122b on the backside of the tapered quartz crystal member 110 and on the underside of the quartz layer of tethering members 130a and 130b. The first interconnect 122a may electrically couple the first electrode 120a to the first pair of bonding pads 140a, and the second interconnect 122b may electrically couple the second electrode 120b to the second pair of bonding pads 140b.

In some examples, the tapered quartz crystal member 110 may be about 100 to about 200 mm (e.g., about 150 mm) long along the longitudinal direction (e.g., the Y-axis), be about 50 to about 100 mm (e.g., about 86 mm) wide along the lateral direction (e.g., the X-axis), and be about 10 to about 20 mm (e.g., about 14 mm) thick along the vertical direction (e.g., the Z-axis). The minimum length of the quartz crystal member 110 may be determined by a maximum motional resistance, such as a maximum motional resistance of 200 ohms. The length-to-width ratio of the active portion 114 may be between 10:1 and 1:1, and in some embodiments may be between 3:1 and 2:1. For some embodiments, the length of the active portion may be several times greater than the width, which may decrease motional resistance.

The longitudinal separation between the first and second pair of bonding pads 140a and 140b may be about 0.1 to about 1 mm (e.g., about 0.5 mm), and the lateral separation between the pads of each of the first and second pair of bonding pads 140a and 140b may be about 70 to about 100 mm (e.g., about 100 mm). The length of each of the first and second tapered portions 112a and 112b may be about 20 to about 30 mm (e.g., about 25 mm). The lateral width (e.g., along the X-axis) of the point of contact between the first and second tapered portions 112a and 112b and corresponding first and second first and second tethering members 130a and 130b may be about 1 to about 10 mm (e.g., about 5 mm). For some embodiments, the width of the narrowest portion of the first and second tapered portions 112a and 112b is less than ½ the maximum lateral width of the active portion 114. In some embodiments, the width of the narrowest portion of the first and second tapered portions 112a and 112b is between $\frac{1}{20}^{th}$ and $\frac{1}{5}^{th}$ of the maximum lateral width of the active portion 114, or between ½ and $\frac{1}{8}^{th}$ of the maximum lateral width of the active portion 114. In some embodiments, the width of the narrowest portion of the first and second tapered portions 112a and 112b is approximately $\frac{1}{10}^{th}$ the width of the maximum lateral width of the active portion 114.

When connected to an antenna 20, an electric field is formed in the lateral direction (e.g., along the X-axis) within the tapered quartz crystal member 110, which excites an extensional mode in the lateral direction. For an electrode separation of about 86 mm in the width, the extensional-mode fundamental frequency may be about 32 kHz. With a thickness of about 14 mm along the vertical direction, the thickness-to-width ratio may be about 0.16, thus yielding a roughly zero $1^{st}$ order (linear) frequency dependence on temperature for a Z-cut theta angle of 27° rotated counter-clockwise around the X axis.

In the above examples, the admittance values in a Van-Dyke equivalent circuit model shown in FIG. 1C may be $L_1=2474$ H, $C_1=10$ fF, $C_0=2$ pF, $R_1=248$ ohm, and $Q=2\times10^6$.

Accordingly, the resonator 100, according to some embodiments, provides the inductance values of a commercial tuning fork design (e.g., 100s to 1000s of H) and with 1) about two orders of magnitude lower $R_1$, 2) an order of magnitude higher Q, 3) higher operation voltages by several orders of magnitude, and 4) temperature compensation equivalent to an AT-cut crystal instead of a parabolic temperature compensation of a tuning fork. Additionally, having a large gap (i.e., >10 mm) between the electrodes 120a and 120b allows the resonator to operate (e.g., operate in linear mode) at much higher voltages (e.g., much higher than 1 V) than quartz resonators of the related art.

While the above examples provide a Q in the $10^6$ range and an inductance of about 10 to 40 H, increasing the longitudinal length of the tapered portions 112a and 112b may provide a higher degree of modal trapping, which may result in Qs near $10^8$ or higher at room temperature.

Figure 3:
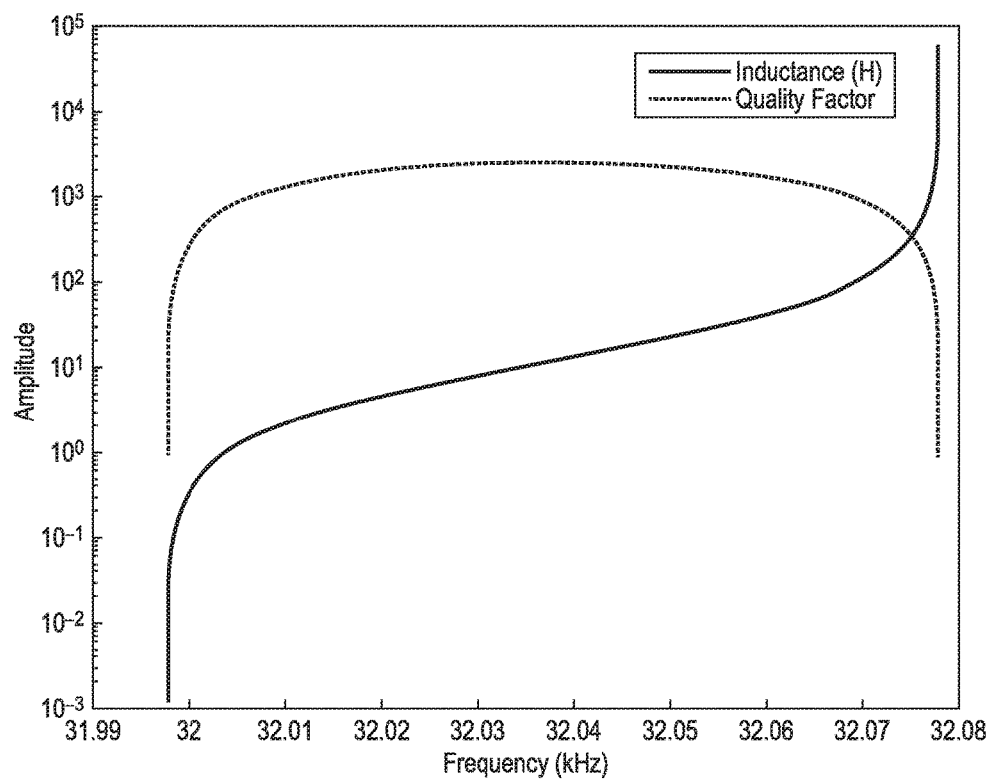
FIG. 3 illustrates a calculated Q and an inductance of a 32 kHz extensional mode resonator used as an inductor matching element in the antenna system, according to some example embodiments of the present invention.

FIG. 3 illustrates a calculated Q and an inductance of the 32 kHz extensional mode resonator 100 of the above examples, used as an inductor matching element in the antenna system 10.

When used as an inductor element for antenna matching at 32 kHz, large reductions in the weight (e.g., 900×) and size (e.g., 3000×) of matching components may be achieved, thus greatly reducing the overall form factor of VLF and LF antenna systems 10 without compromising efficiency. Furthermore, due to this dramatic reduction in size and weight, these components can be center loaded in large VLF and LF monopoles, lessening the need for large capacitive top loading structures.

Figure 4:
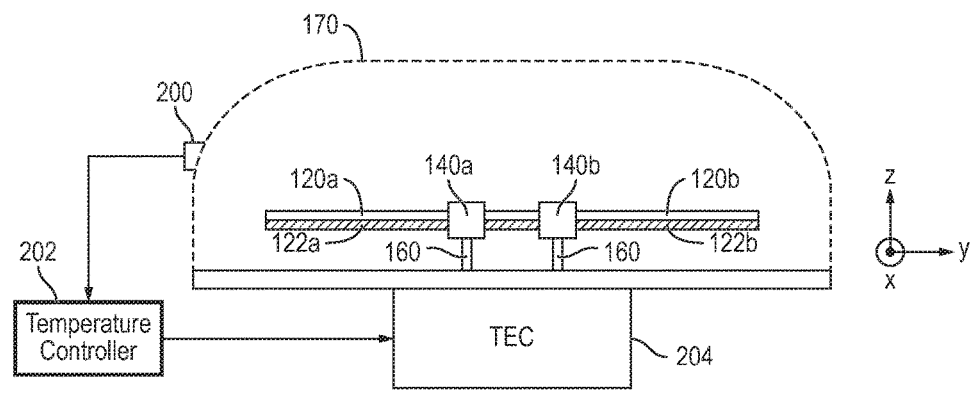
FIG. 4 illustrates a side view of the high quality-factor electromechanical resonator of FIG. 2A, according to some example embodiments of the present invention.

FIG. 4 illustrates a side view of the high quality-factor electromechanical resonator 100 of FIG. 2A, according to some embodiments of the present invention.

As the vibration of the tapered quartz crystal member 110 may be sensitive to air damping, in some embodiments, the tapered quartz crystal member 110 and the tethering members 130a and 130b are packaged in vacuum (or substantial vacuum) in order to increase or maximize Q of the resonator 100. In some examples, the package 170 may be a hermetically sealed glass, a metal case, or the like, which may be vacuumed or be filled with a dry and inert atmosphere, nitrogen, helium, and/or the like.

In some examples, solder or electrically conductive polymer may be used to connect the bond sites to mounts or protrusions 160 for passing the signals through a package (e.g., a vacuum package) 170 while the tethering members 130a and 130b reduce stress propagation from the package to the tapered quartz crystal member 110 over temperature extremes.

In some embodiments, the resonator 100 is cooled in order to reduce or prevent any degradation in the linearity and shifts in the resonance of the resonator 100. According to some embodiments, the temperature of the resonator 100 is regulated by utilizing a sensor 200 to detect the temperature of the resonator 100, a temperature controller 202 for controlling a thermoelectric cooler (TEC) 204 to cool the resonator 100, for example, to cool the substrate 150, when the sensed temperature of the resonator exceeds a threshold (e.g., about 200° C.). In some examples, water and air cooling techniques may be utilized to cool the resonator 100. In some embodiments, the matching network for an antenna 20 can be used to sense any changes in the impedance or resonant frequency of the resonator 100 and to slightly adjust the frequency of the antenna system 10.

When mounted in a vacuum package with cooling techniques, the resonator 100 may offer high Q and high inductance in a much smaller size and with much less weight compared to traditional coil inductors. This allows the inductors to be placed at optimal positions (approximately at the midpoint) along the antenna 20.

It will be understood that, although the terms "first," "second," "third," etc., may be used herein to describe various elements, components, regions, layers, and/or sections, these elements, components, regions, layers, and/or sections should not be limited by these terms. These terms are used to distinguish one element, component, region, layer, or section from another element, component, region, layer, or section. Thus, a first element, component, region, layer, or section discussed below could be termed a second element, component, region, layer, or section, without departing from the spirit and scope of the inventive concept.

The terminology used herein is for the purpose of describing particular embodiments and is not intended to be limiting of the inventive concept. As used herein, the singular forms "a" and "an" are intended to include the plural forms as well, unless the context clearly indicates otherwise. It will be further understood that the terms "include," "including," "comprises," and/or "comprising," when used in this specification, specify the presence of stated features, integers, steps, operations, elements, and/or components, but do not preclude the presence or addition of one or more other features, integers, steps, operations, elements, components, and/or groups thereof. As used herein, the term "and/or" includes any and all combinations of one or more of the associated listed items. Expressions such as "at least one of," when preceding a list of elements, modify the entire list of elements and do not modify the individual elements of the list. Further, the use of "may" when describing embodiments of the inventive concept refers to "one or more embodiments of the inventive concept."

It will be understood that when an element is referred to as being "connected to" or "coupled to" another element, it can be directly connected to or coupled to the other element, or one or more intervening elements may be present. When an element is referred to as being "directly connected to," or "directly coupled to," another element, there are no intervening elements present.

As used herein, the terms "substantially," "about," and similar terms are used as terms of approximation and not as terms of degree, and are intended to account for the inherent variations in measured or calculated values that would be recognized by those of ordinary skill in the art.

As used herein, the terms "use," "using," and "used" may be considered synonymous with the terms "utilize," "utilizing," and "utilized," respectively.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein. All such ranges are intended to be inherently described in this specification.

The transceiver and/or any other relevant devices or components according to embodiments of the present invention described herein may be implemented utilizing any suitable hardware, firmware (e.g. an application-specific integrated circuit), software, or a suitable combination of software, firmware, and hardware. For example, the various components of the transceiver may be formed on one integrated circuit (IC) chip or on separate IC chips. Further, the various components of the transceiver may be implemented on a flexible printed circuit film, a tape carrier package (TCP), a printed circuit board (PCB), or formed on a same substrate. Further, the various components of the transceiver may be a process or thread, running on one or more processors, in one or more computing devices, executing computer program instructions and interacting with other system components for performing the various functionalities described herein. The computer program instructions are stored in a memory which may be implemented in a computing device using a standard memory device, such as, for example, a random access memory (RAM). The computer program instructions may also be stored in other non-transitory computer readable media such as, for example, a CD-ROM, flash drive, or the like. Also, a person of skill in the art should recognize that the functionality of various computing devices may be combined or integrated into a single computing device, or the functionality of a particular computing device may be distributed across one or more other computing devices without departing from the scope of the exemplary embodiments of the present invention.

While this invention has been described in detail with particular references to illustrative embodiments thereof, the embodiments described herein are not intended to be exhaustive or to limit the scope of the invention to the exact forms disclosed. Persons skilled in the art and technology to which this invention pertains will appreciate that alterations and changes in the described structures and methods of assembly and operation can be practiced without meaningfully departing from the principles, spirit, and scope of this invention, as set forth in the following claims and equivalents thereof.

What is claimed is:

1. A high quality-factor electromechanical resonator comprising:
    a tapered quartz crystal member having a first tapered portion, a second tapered portion, and an active portion between the first tapered portion and the second tapered portion, the active portion having a first edge portion and a second edge portion extending along a longitudinal axis from the first tapered portion to the second tapered portion, each of the first tapered portion and the second tapered portion being tapered along the longitudinal axis away from the active portion;
    a first electrode coupled to the first edge portion of the active portion and configured to apply a first voltage to the active portion; and
    a second electrode coupled to the second edge portion of the active portion and configured to apply a second voltage to the active portion,
    wherein the first and second electrodes respectively extend along the first and second edge portions of the active portion and are spaced apart along a lateral axis, and
    wherein, in operation, an extensional mode of vibration is confined to the active portion.

2. The high quality-factor electromechanical resonator of claim 1, wherein the first and second voltages generate an electric field across the active portion that induces acoustical vibrations within the active portion along the lateral axis, and
    wherein the acoustical vibrations are in low frequency (LF) to very low frequency (VLF) ranges.

3. The high quality-factor electromechanical resonator of claim 2, wherein the first and second tapered portions are configured to confine low frequency oscillation modes induced by the electric field to the active portion.

4. The high quality-factor electromechanical resonator of claim 1, wherein the first and second electrodes wrap around and clamp the first edge portion and the second edge portion, respectively.

5. The high quality-factor electromechanical resonator of claim 1, wherein the first and second electrodes extend along the longitudinal axis.

6. The high quality-factor electromechanical resonator of claim 1, wherein the tapered quartz crystal member is hermetically sealed in a vacuum package.

7. The high quality-factor electromechanical resonator of claim 1, wherein the tapered quartz crystal member is a Z-cut theta angle of 27 degrees rotated counter-clockwise around an X axis.

8. The high quality-factor electromechanical resonator of claim 1, wherein the first electrode is laterally spaced from the second electrode by 10 mm or more.

9. The high quality-factor electromechanical resonator of claim 1, wherein a length of the tapered quartz crystal member along the longitudinal axis is about 150 mm and a width of the tapered quartz crystal member along the lateral axis is about 86 mm.

10. The high quality-factor electromechanical resonator of claim 1, wherein a fundamental frequency of the extensional mode is about 32 kHz.

11. A high quality-factor electromechanical resonator comprising:
a tapered quartz crystal member having a first tapered portion, a second tapered portion, and an active portion between the first tapered portion and the second tapered portion, the active portion having a first edge portion and a second edge portion extending from the first tapered portion to the second tapered portion, each of the first tapered portion and the second tapered portion being tapered along a longitudinal axis away from the active portion;
a first electrode coupled to the first edge portion of the active portion and configured to apply a first voltage to the active portion;
a second electrode coupled to the second edge portion of the active portion and configured to apply a second voltage to the active portion;
a first tethering member coupling a first extremity of the first tapered portion to a first pair of bonding pads; and
a second tethering member coupling a second extremity of the second tapered portion to a second pair of bonding pads,
wherein the first and second electrodes are spaced apart along a lateral axis, and
wherein the first and second electrodes are between each of the first and second pair of bonding pads along the lateral axis.

12. The high quality-factor electromechanical resonator of claim 11, wherein the first and second pair of bonding pads lie on a horizontal plane that extends along the lateral and longitudinal axes and is parallel to a plane of extension of the tapered quartz crystal member.

13. The high quality-factor electromechanical resonator of claim 11, wherein each of the first and second tethering members has a first portion extending along the lateral axis, a second portion extending along the longitudinal axis, and a convex corner between the first and second portions, and
wherein the first and second tethering members form a partial frame around the tapered quartz crystal member.

14. The high quality-factor electromechanical resonator of claim 11, wherein a longitudinal distance between the first and second pair of bonding pads is less than a length of the first and second electrodes along the longitudinal axis.

15. The high quality-factor electromechanical resonator of claim 11, wherein each of the first and second tethering members comprises:
a quartz layer integrated with the tapered quartz crystal member;
a bonding pad configured to receive a respective one of the first and second voltages; and
a conductive layer electrically coupling the bonding pad to a respective one of the first and second electrodes via a respective one of a first connection and a second connection.

16. The high quality-factor electromechanical resonator of claim 15, wherein the quartz layer and the tapered quartz crystal member are carved out of a same quartz crystal slice and form a continuous body.

17. The high quality-factor electromechanical resonator of claim 11, further comprising:
a substrate;
a first protrusion on the substrate and coupled to the first tethering member; and
a second protrusion on the substrate and coupled to the second tethering member,
wherein the first and second protrusions are configured to physically support and to separate the tapered quartz crystal member and the first and second tethering members from the substrate along a vertical axis crossing the longitudinal and lateral axes.

18. The high quality-factor electromechanical resonator of claim 17, further comprising:
a thermo-electric cooler coupled to the substrate and configured to cool the substrate.

19. An antenna system comprising:
an antenna configured to transmit a wireless signal based on an input signal, or to receive the wireless signal and to generate the input signal based on received wireless signal;
a transceiver circuit coupled to the antenna and configured to supply the input signal to the antenna or to receive the input signal from the antenna; and
a high quality-factor electromechanical resonator coupled to the antenna and the transceiver circuit and configured to facilitate network matching in the antenna system, the high quality-factor electromechanical resonator comprises:
a tapered quartz crystal member having a first tapered portion, a second tapered portion, and an active portion between the first and second tapered portions, the active portion having a first edge portion and a second edge portion extending along a longitudinal axis from the first tapered portion to the second tapered portion, each of the first and second tapered portions being tapered along the longitudinal axis away from the active portion;
a first electrode coupled to the first edge portion of the active portion and configured to apply a first voltage to the active portion; and
a second electrode coupled to the second edge portion of the active portion and configured to apply a second voltage to the active portion,
wherein the first and second electrodes respectively extend along the first and second edge portions of the active portion and are spaced apart along a lateral axis, and
wherein, in operation, an extensional mode of vibration is confined to the active portion.

20. The antenna system of claim 19, wherein the first electrode is electrically coupled to the antenna and the second electrode is electrically coupled to the transceiver circuit.

* * * * *